United States Patent [19]

Ernst

[11] Patent Number: 5,111,358
[45] Date of Patent: May 5, 1992

[54] ELECTRICAL EQUIPMENT WITH MODE INDICATOR

[75] Inventor: Leonard Ernst, Boonton, N.J.

[73] Assignee: Dowty RFL Industries Inc., Boonton, N.J.

[21] Appl. No.: 672,177

[22] Filed: Mar. 20, 1991

[51] Int. Cl.⁵ .............................................. H02B 1/26
[52] U.S. Cl. ................................... 361/334; 361/392; 361/394; 361/399; 307/150
[58] Field of Search ............... 361/334, 395, 394, 392, 361/399; 340/815.06, 815.07, 815.14; 307/150

[56] References Cited

U.S. PATENT DOCUMENTS 4,481,661 11/1984 Spector .................................. 381/61
4,503,484 3/1985 Moxon ................................. 361/395

Primary Examiner—Leo P. Picard
Assistant Examiner—Young S. Whang
Attorney, Agent, or Firm—Martin M. Novack

[57] ABSTRACT

Electrical equipment which is configurable to operate in a number of modes includes an enclosure, a transparent window in the enclosure through which may be viewed a connector which configures the equipment in a selected mode so enabling a user to determine the mode.

6 Claims, 5 Drawing Sheets

ELECTRICAL EQUIPMENT WITH MODE INDICATOR

BACKGROUND OF THE INVENTION

This invention relates to electrical equipment which is configurable to operate in one of a number of possible modes of operation.

Such equipment is housed in an enclosure and has to be configured in a selected mode by a manufacturer prior to fitting of the enclosure. The manufacturer then attaches a label to the enclosure giving information as to the configuration which has been selected. In order to provide for all of the possible modes of operation, a corresponding number of labels must be provided which leads to an undesirable rise in component numbers. With a labelling system, there also exists a risk of incorrectly labelling the equipment, a risk which increases with a rise in the number of modes. For some electrical equipment, the consequences of mislabelling may be serious since the equipment may be damaged or may become hazardous to the user. Furthermore, even if the equipment is correctly labelled, the label may become detached from the equipment during shipment or when the equipment is unpacked, possibly leading to damage.

SUMMARY OF THE INVENTION

According to the invention there is provided electrical equipment configurable to operate in one of a number of possible modes comprising an enclosure, an optically transparent window in the enclosure, electrical circuitry located within the enclosure, connection means for electrically interconnecting the electrical circuitry to configure the equipment in a selected mode such that the connection means are visible but not accessible through the window to give an indication of said selected mode.

By making the connection means visible through a window, the user will be able to determine the configuration of the equipment by a simple visual inspection. In whatever mode the equipment is configured, the configuration will be automatically visible through the window ensuring that a label will no longer be required to be attached eliminating labelling errors and reducing the component numbers. The connection means will not be accessible through the window so the equipment will be protected from tampering or accidental reconfiguring.

The window may be an aperture in the enclosure but preferably it comprises an optically transparent material to prevent ingress of dust into the enclosure whilst still allowing the configuration to be seen. The material used could include glass or plastics materials which may be located within the aperture to provide a flush outer surface to the enclosure or it may be located on a surface of the enclosure to provide a cover to the aperture.

A specific embodiment of the invention will now be described, by way of example only, with reference to the accompanying drawings.

DESCRIPTION OF THE PREFERRED EMBODIMENT

Figure 1:
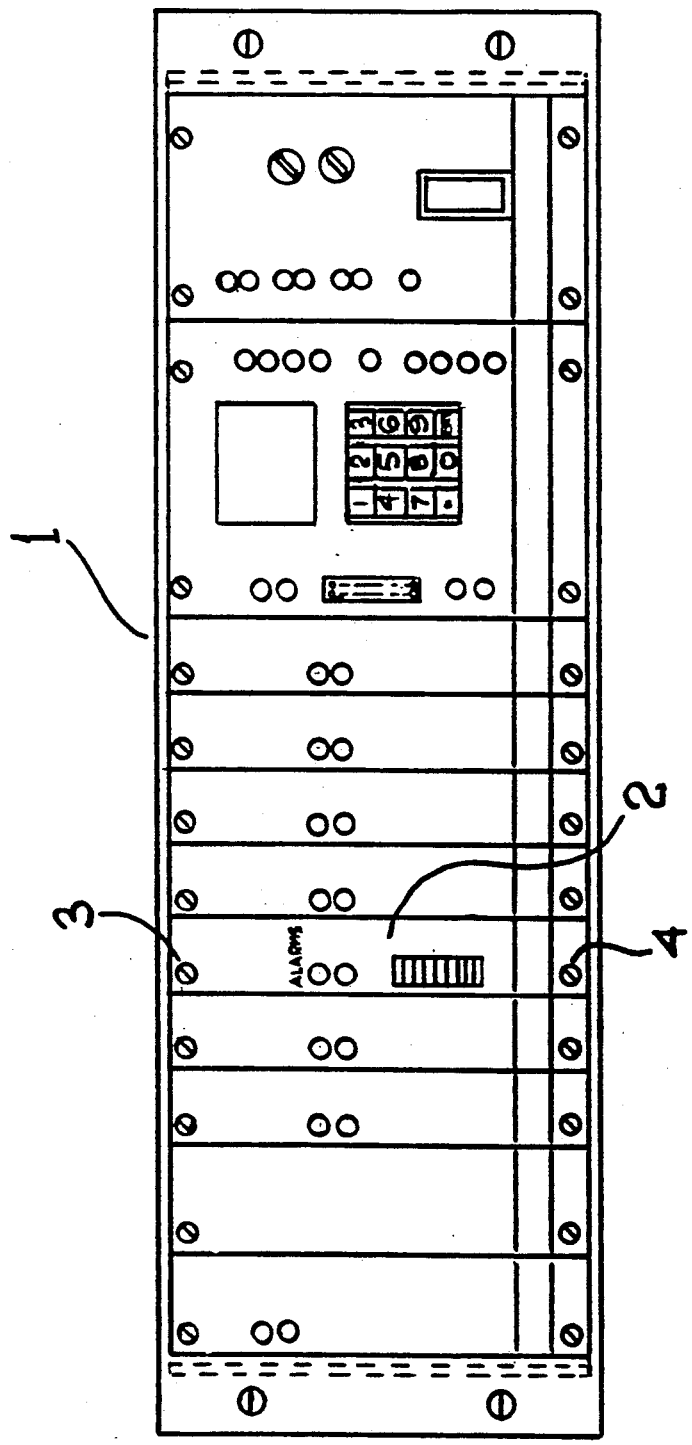
FIG. 1 shows a front view of electrical equipment in accordance with the invention.

There is shown in FIG. 1, a charge comparison system (ccs) generally indicated at 1. A detailed knowledge of the operation of such a system 1 is not necessary for an understanding of the invention, it is only an illustrative example of electrical equipment in which the invention may be usefully employed and its function will only be briefly described. The system 1 is used to monitor an electrical power supply for power surges or leakage of power to earth and is therefore configurable to operate in a number of modes to be compatible with the power supply.

The system 1 is formed from a number of circuit modules which are located behind, and attached to, a number of panel segments one of which is labelled 2, which together form a front panel of the system 1. It is possible to service the circuit modules by removing screws in the relevant panel segment, for example screws 3 and 4 in the case of panel segment 2, and withdrawing the segment with its attached circuit module.

Figure 2B:
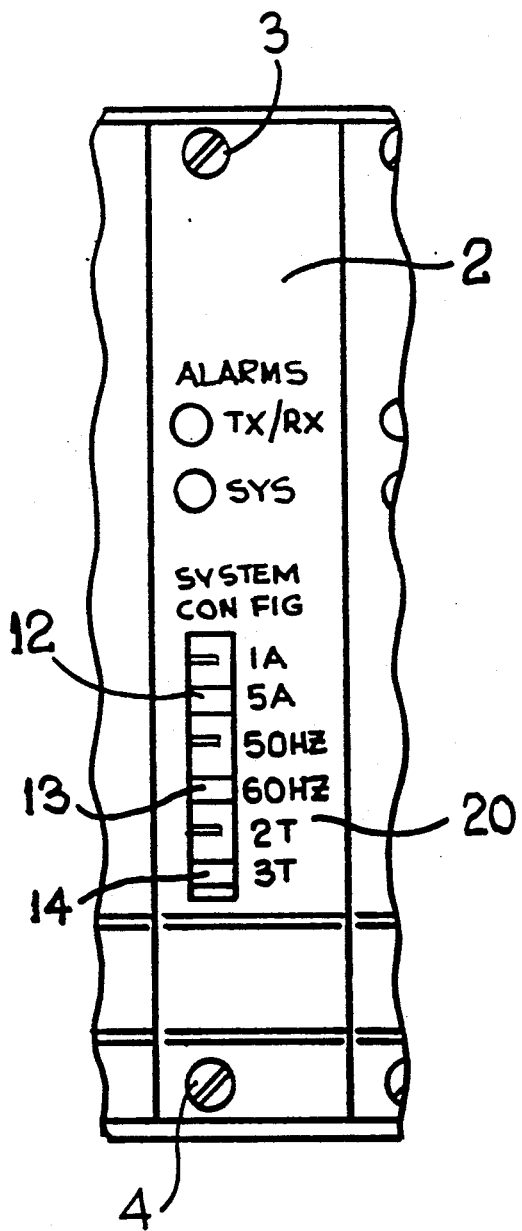
FIG. 2b shows an enlarged view of that part of the equipment behind which the card is located.
Figure 2A:
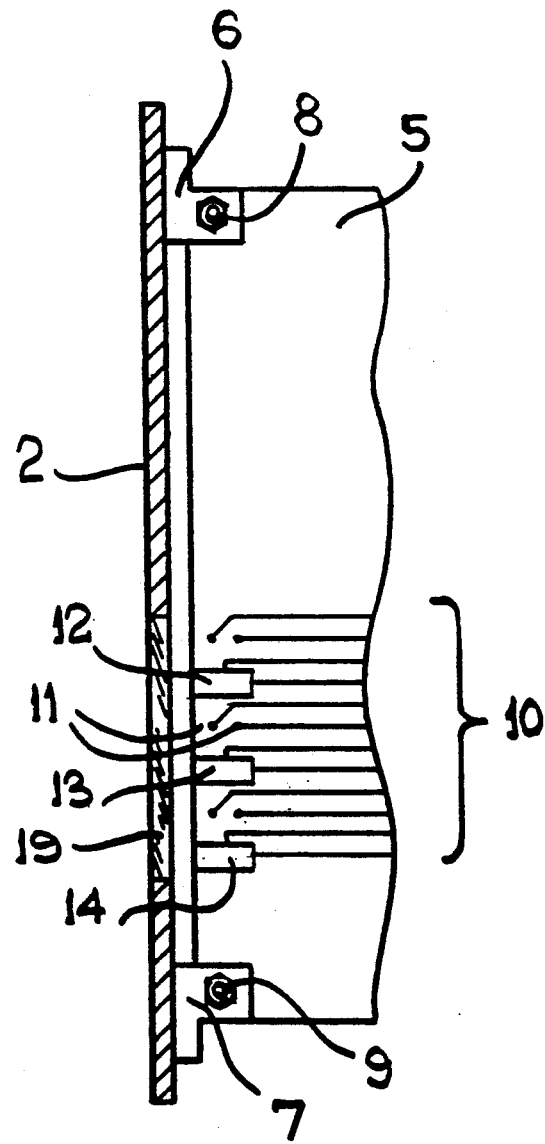
FIG. 2a shows a partial view of a configuration card used in the electrical equipment shown in FIG. 1.

FIG. 2a shows part of the circuit module associated with panel segment 2 which is concerned with configuration of the system 1. The modules are often called cards because they are generally planar and the particular module concerned with the configuration of the system 1 is called a configuration card. It comprises a printed circuit board 5 onto which electrical components (not shown) are mounted. The printed circuit board 5 is attached to the panel segment 2 by means of brackets 6 and 7 fixed to a rear surface of panel segment 2 and nuts and bolts 8 and 9.

Figure 3:
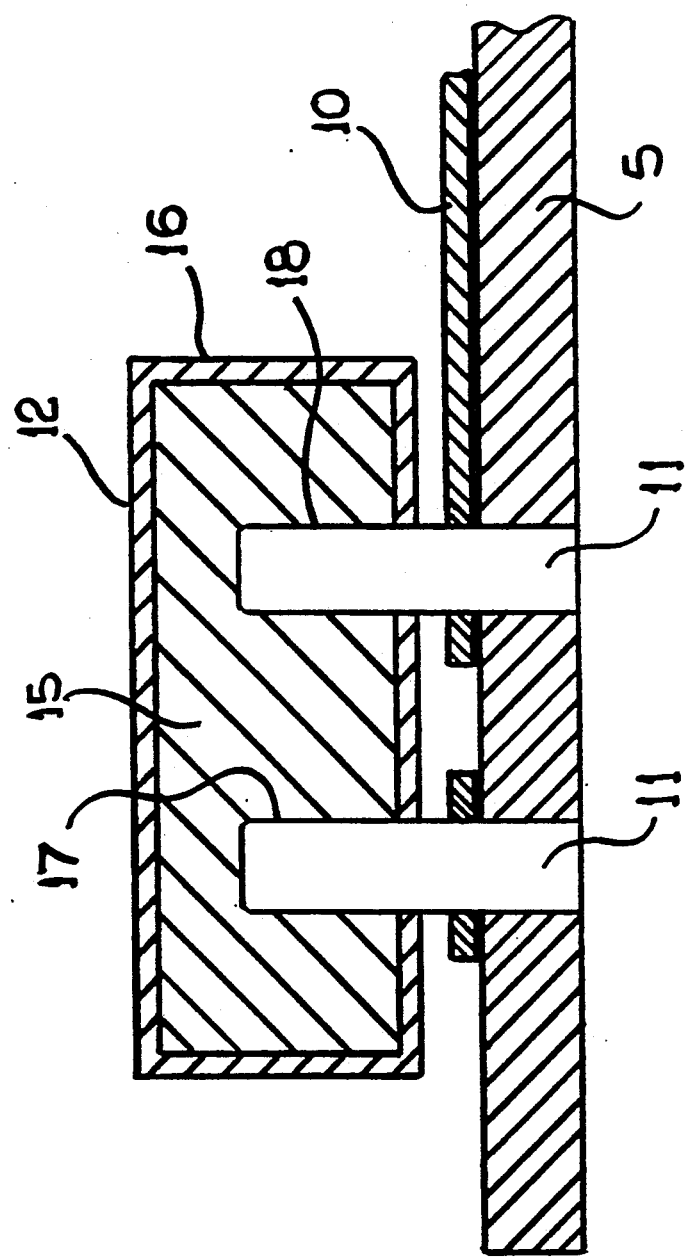
FIG. 3 shows a connector used in the electrical equipment of FIG. 1.

The printed circuit board 5 also bears conductive lands 10 each terminated in a conductive pin 11 soldered to the land substantially perpendicularly to the plane of the circuit board 5. It is by selectively electrically connecting these pins 11 together that a particular mode of operation is configured. The connections are achieved by use of nominally identical connectors 12, 13 and 14 each comprising, as shown in FIG. 3, a copper body 15 coated with a white coating 16 and provided with two sockets 17 and 18 for accepting the pins 11 to form a good electrical contact therebetween.

A window 19 is formed in the panel segment 2 during manufacture to be adjacent that part of the circuit board 5 bearing the conductive lands 10. The window 19 is glazed with optically transparent plastics material so that the connectors 12, 13 and 14 can be seen and their positions compared with a legend 20 printed on the outer surface of the panel segment 2 next to the window 19, as shown in FIG. 2b, to determine the mode in which the equipment 1 is configured. In this case the connectors 12, 13 and 14 are adjacent 5 A, 60 Hz and 3 T of the legend 20, thereby indicating that the system is configured to operate with a five ampere supply of frequency sixty hertz and three terminal operation.

Figure 4A:
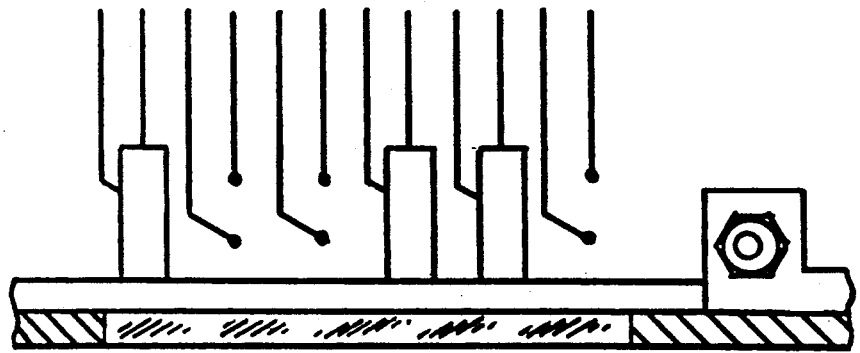
FIGS. 4a, 4b and 5a, 5b show alternative configurations.
Figure 4B:
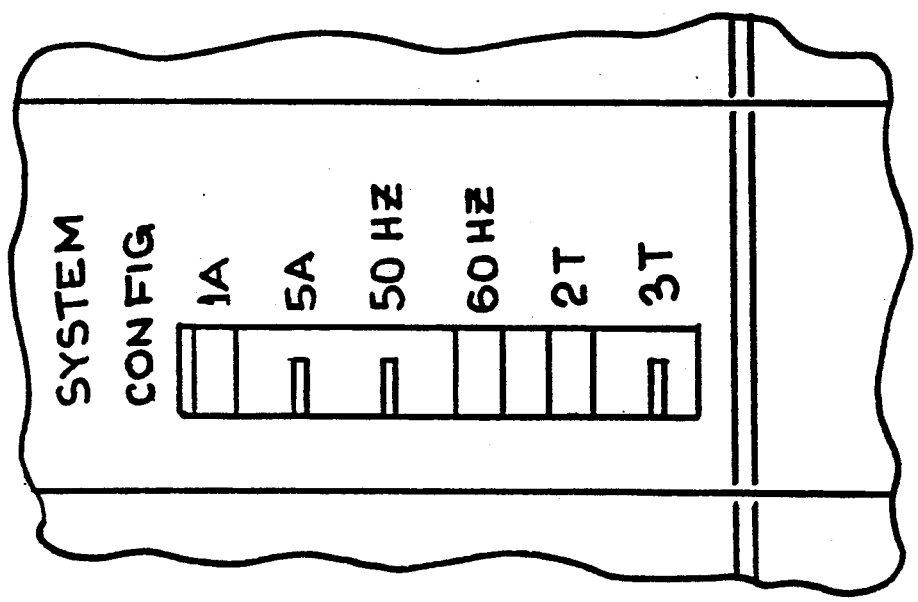
Figure 5A:
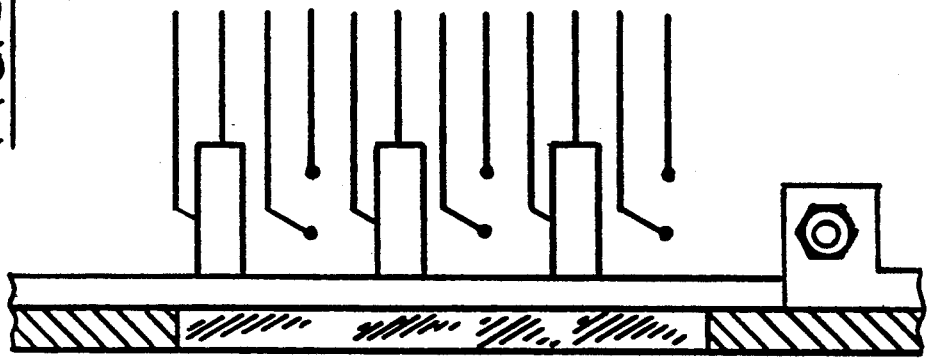
Figure 5B:
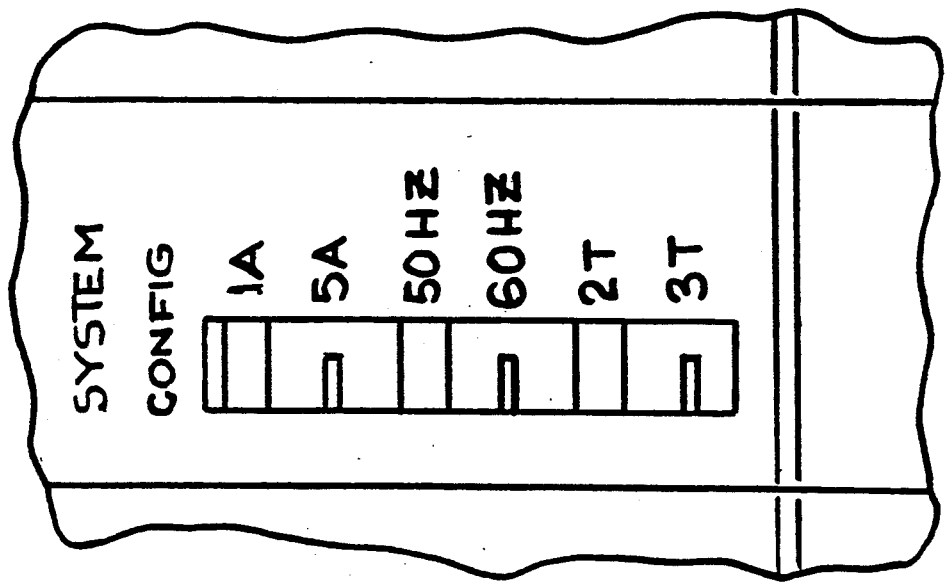

By connecting different pairs of pins 11 together it is possible for the system 1 to be configured in other modes of operation. FIG. 4a and 4b shows the system 1 configured to operate with a one ampere, sixty hertz supply and two terminal operation. FIG. 5a and 5b shows the system 1 configured for a one ampere, fifty hertz supply and two terminal operation.

The invention may be used to indicate many more configurations than those described and the connectors may be dip or other types of switches or may be replaced by a single multiposition switch.

I claim:

1. Electrical equipment configurable to operate in one of a number of possible modes, comprising: an enclosure; an optically transparent window in said enclosure; electrical circuitry located within the enclosure; connection means for electrically interconnecting the electrical circuitry to configure the equipment in a selected mode such that the connection means are visible but not accessible through the window to give an indication of said selected mode; the enclosure having markings on its outer surface indicative of said possible modes arranged in relation to said window so that the connection means, in each of the different possible mode selections, indicates a corresponding marking for that mode.

2. Equipment as claimed in claim 1 in which the connection means comprises at least one connector which is selectively engageable and disengageable with the electrical circuitry, the presence of said connector providing an indication of said selected mode.

3. Equipment as claimed in claim 2 in which said connector is selectively engageable with the electrical circuitry in any one of a plurality of different locations, each corresponding to a different mode.

4. Equipment as claimed in claim 3 in which said connector comprises a pin and socket type connector.

5. Electrical equipment configurable to operate in one of a number of possible modes, comprising: an enclosure; a window in said enclosure; electrical circuitry located within the enclosure; connection means for electrically interconnecting the electrical circuitry to configure the equipment in a selected mode such that the connection means are visible through the window to give an indication of said selected mode; said connection means comprising at least one connector which is selectively engageable and disengageable with the electrical circuitry, the presence of said connector providing an indication of said selected mode said enclosure carrying on its outer surface markings indicative of said possible modes arranged in relation to said window so that said connector, in each of the different possible mode selection settings, indicates a corresponding marking for that mode.

6. Equipment as claimed in claim 5 in which said connector is selectively engageable with the electrical circuitry in any one of a plurality of different locations, each corresponding to a different mode.

* * * * *